(12) United States Patent
McCracken et al.

(10) Patent No.: US 11,295,828 B2
(45) Date of Patent: Apr. 5, 2022

(54) MULTI-CHIP PROGRAMMING FOR PHASED ARRAY

(71) Applicant: Analog Devices International Unlimited Company, County Limerick (IE)

(72) Inventors: Stuart John McCracken, Arlington, MA (US); Mohamed El-Nozahi, Giza (EG); Mohamed Abdelsalam, Giza (EG)

(73) Assignee: Analog Devices International Unlimited Company, Limerick (IE)

( * ) Notice: Subject to any disclaimer, the term of this patent is extended or adjusted under 35 U.S.C. 154(b) by 73 days.

(21) Appl. No.: 16/789,974

(22) Filed: Feb. 13, 2020

(65) Prior Publication Data

US 2020/0286571 A1    Sep. 10, 2020

Related U.S. Application Data

(60) Provisional application No. 62/815,900, filed on Mar. 8, 2019.

(51) Int. Cl.
*G11C 19/28* (2006.01)
*G11C 19/18* (2006.01)

(52) U.S. Cl.
CPC ............ *G11C 19/28* (2013.01); *G11C 19/188* (2013.01)

(58) Field of Classification Search
CPC .............................. G11C 19/28; G11C 19/287
See application file for complete search history.

(56) References Cited

U.S. PATENT DOCUMENTS

| 4,739,323 A | 4/1988 | Miesterfeld et al. |
| 4,816,996 A | 3/1989 | Hill et al. |

(Continued)

FOREIGN PATENT DOCUMENTS

| EP | 2645638 A1 | 10/2013 |
| JP | 2018-045409 | 3/2018 |

(Continued)

OTHER PUBLICATIONS

TMS320DM36x Digital Media System-on-Chip (DMSoC) Serial Peripheral Interface (SPI) User Guide, Texas Instruments, Mar. 2009; Literature No. SPRUFH1B.

(Continued)

*Primary Examiner* — Patrick ONeill
(74) *Attorney, Agent, or Firm* — Knobbe, Martens, Olson & Bear, LLP (57) ABSTRACT

Systems and methods for multi-chip programming for phased arrays are provided herein. In certain embodiments, a semiconductor device includes one or more inputs configured to receive frame data, an internal memory configured to store the received frame data, and a shift register configured to receive the frame data and comprising a plurality of shift register bit positions. The device further includes a latch configured to store a command type, a first multiplexor configured to select at least one first bit from the shift register based on the command type and provide the at least one first bit to the latch, an output configured to output the frame data, and a second multiplexor configured to select at least one second bit from the shift register based on the command type and provide the at least one second bit to the output.

20 Claims, 7 Drawing Sheets

(56) References Cited

U.S. PATENT DOCUMENTS

| | | | |
|---|---|---|---|
| 4,958,277 | A | 9/1990 | Hill et al. |
| 5,021,775 | A | 6/1991 | Babin |
| 5,793,993 | A | 8/1998 | Broedner et al. |
| 5,828,592 | A | 10/1998 | Tran et al. |
| 7,082,481 | B2 | 7/2006 | Lambrache et al. |
| 7,660,968 | B2 | 2/2010 | Alfano et al. |
| 7,769,909 | B2 | 8/2010 | Ho et al. |
| 7,830,906 | B2 | 11/2010 | Satoh et al. |
| 7,848,825 | B2 | 12/2010 | Wilson et al. |
| 7,983,308 | B1 | 7/2011 | Johnston et al. |
| 8,364,873 | B2 | 1/2013 | Chen |
| 8,417,836 | B2 | 4/2013 | Obkircher |
| 9,252,969 | B2 | 2/2016 | Rohatschek et al. |
| 9,450,620 | B1 | 9/2016 | Ahmed et al. |
| 9,622,310 | B2 | 4/2017 | Williams et al. |
| 10,002,090 | B2 | 6/2018 | Warriner et al. |
| 10,216,678 | B2 | 2/2019 | Murtaza et al. |
| 10,318,447 | B2 | 6/2019 | Spence et al. |
| 10,990,559 | B2 * | 4/2021 | Wang .................. G06F 13/4256 |
| 2019/0278736 | A1 | 9/2019 | Aherne et al. |

FOREIGN PATENT DOCUMENTS

| | | |
|---|---|---|
| JP | 2018-519576 A | 7/2018 |
| KR | 20080013548 A | 2/2008 |
| WO | WO 2018/116314 A1 | 6/2018 |

OTHER PUBLICATIONS

TMS320DM36x DMSoC Multichannel Buffered Serial Port (McBSP) Interface; User Guide, Texas Instruments, Mar. 2009; Literature No. SPRUFI3A.

* cited by examiner

MULTI-CHIP PROGRAMMING FOR PHASED ARRAY

CROSS-REFERENCE TO RELATED APPLICATIONS

The present application claims priority to U.S. Provisional Patent Application No. 62/815,900, filed Mar. 8, 2019, and titled "MULTI-CHIP PROGRAMMING FOR PHASED ARRAY," the entirety of which is hereby incorporated herein by reference.

BACKGROUND

Field

The disclosed technology relates generally to semiconductor devices, and more particularly to an improved communication interface for programming a plurality of chips.

Description of the Related Technology

Serial Peripheral Interface (SPI) is one of the most widely used interfaces to facilitate communication between an SPI master controller and a plurality of SPI slave chips. One application for SPI interface includes the programming of the chips for beamforming. Beamforming can be used to focus signal strength to overcome path losses, such as high loss associated with communicating over high signal frequencies. In order to achieve beamforming, the phase and gain settings are programmed for each chip included in an array of chips. SPI is one interface that can be used to program the array of chips to provide beamforming.

SUMMARY OF THE DISCLOSURE

The systems, methods and devices of this disclosure each have several innovative aspects, no single one of which is solely responsible for the all of the desirable attributes disclosed herein. Details of one or more implementations of the subject matter described in this specification are set forth in the accompanying drawings and the description below.

Systems and methods for multi-chip programming for phased arrays are provided herein. In one aspect, a semiconductor device includes one or more inputs configured to receive frame data; an internal memory configured to store the received frame data; and a shift register configured to receive the frame data and comprising a plurality of shift register bit positions. The semiconductor device can further include a latch configured to store a command type; and a first multiplexor configured to select at least one first bit from the shift register based on the command type and provide the at least one first bit to the latch. The semiconductor device can also include an output configured to output the frame data; and a second multiplexor configured to select at least one second bit from the shift register based on the command type and provide the at least one second bit to the output.

In some aspects, the first multiplexor is further configured to select the at least one first bit from a first shift register bit position when the command type indicates that the frame data has a first frame type and select the at least one first bit from a second shift register bit position when the command type indicates that the frame data has a second frame type.

In some aspects, the first frame type is a short format having a first frame length defined by a first number of bits of data and the second frame type is a long format having a second frame length defined by a second number of bits of data, the second number is greater than the first number, and wherein the second shift register bit position has a higher value than the first number.

In some aspects, the second multiplexor is further configured to select the at least one second bit from a first shift register bit position when the command type indicates that the frame data has a first frame type, select the at least one second bit from a second shift register bit position when the command type indicates that the frame data has a second frame type, and select the at least one second bit from a third shift register bit position when the command type indicates that the frame data has a third frame type.

In some aspects, the first frame type is an extra-short format having a first frame length defined by a first number of bits of data, the second frame type is a short format having a second frame length defined by a second number of bits of data, and the third frame type is a long format having a third frame length defined by a third number of bits of data, the second number is greater than the first number and the third number is greater than the second number, wherein the second shift register bit position has a higher value than the first number and the third shift register bit position has a higher value than the second number.

In some aspects, the latch is further configured to receive the command type from the first multiplexor.

In some aspects, the latch is further configured to receive a clock signal and store the command type received from the first multiplexor based on an edge of the clock signal.

In some aspects, the latch is further configured to receive an enable signal and a clock signal and store the command type received from the first multiplexor based on an edge of the clock signal and in response to receiving the enable signal.

In some aspects, the one or more inputs are configured to receive the frame data indirectly from a master semiconductor device via a slave semiconductor device.

In some aspects, the one or more inputs and the output are configured to be connected to a plurality of slave semiconductor devices in either a parallel configuration or a series configuration.

In another aspect, a semiconductor device includes a first input configured to receive a clock signal; a second input configured to receive frame data; and a third include configured to receive a semiconductor device select signal. The semiconductor device can also include a shift register configured to receive the frame data; and an internal memory configured to store the received data. The frame data can include one or more bits comprising a broadcast indicator.

In some aspects, the frame data further comprises: one or more bits indicative of a semiconductor device address, one or more bits indicative of an internal memory address, one or more bits comprising data, and one or more bits comprising a read and write indicator.

In some aspects, the semiconductor device further comprises logic configured to: determine that the one or more broadcast indicator bits are disabled, determine that the read and write indicator bits are indicative of write, match the semiconductor address bits to an address of the semiconductor device, and store the data in the internal memory based on the internal memory address bits.

In some aspects, the semiconductor device further comprises logic configured to: determine that the broadcast indicator bits are enabled, determine that the read and write indicator bits are for write, and store the data in the internal memory based on the internal memory address bits.

In some aspects, the semiconductor device further comprises logic configured to: determine that the read and write indicator bits are for read, match the semiconductor address bits to an address of the semiconductor device, ignore the broadcast indictor bits, and read data from the internal memory based on the internal memory address bits.

In yet another aspect, a serial peripheral interface (SPI) system, includes a primary SPI chip configured to output frame data and a broadcast indicator signal; and a plurality of secondary SPI chips configured to receive the frame data and the broadcast indicator signal from the primary SPI chip. The secondary SPI chips are further configured to store the frame data in response to the broadcast indicator signal being enabled.

In some aspects, each of the secondary SPI chips comprises: a first input configured to receive a clock signal; a second input configured to receive the frame data; a third input configured to receive a semiconductor device select signal; one or more fourth inputs configured to receive the broadcast indicator signal; a shift register configured to receive the frame data; and an internal memory to store the frame data.

In some aspects, the frame data comprises: one or more bits indicative of a semiconductor device address, one or more bits indicative of an internal memory address, one or more bits comprising data, and one or more bits comprising a read and write indicator.

In some aspects, each of the secondary SPI chips further comprises logic configured to: determine that the broadcast indicator signal is disabled, determine that the read and write indicator bits are for write, match the semiconductor address bits to an address of the semiconductor device, and store the data in the internal memory based on the internal memory address bits.

In some aspects, each of the secondary SPI chips further comprises logic configured to: determine that the broadcast indicator signal is enabled, determine that the read and write indicator bits are for write, and store the data in the internal memory based on the internal memory address bits.

BRIEF DESCRIPTION OF THE DRAWINGS

Aspects and advantages of the embodiments provided herein are described with reference to the following detailed description in conjunction with the accompanying drawings. Throughout the drawings, reference numbers may be re-used to indicate correspondence between referenced elements. The drawings are provided to illustrate example embodiments described herein and are not intended to limit the scope of the disclosure. In addition, various features of different disclosed embodiments can be combined to form additional embodiments, which are part of this disclosure. Any feature or structure can be removed or omitted.

DETAILED DESCRIPTION

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

In this description, references to "an embodiment," "one embodiment," or the like, mean that the particular feature, function, structure or characteristic being described is included in at least one embodiment of the technique introduced herein. Occurrences of such phrases in this specification do not necessarily all refer to the same embodiment. On the other hand, the embodiments referred to are also not necessarily mutually exclusive.

Aspects of this disclosure relate to an improved SPI interface enabling faster programming of a plurality of slave SPI chips using a variable length frame. By using a variable length frame, the described SPI interface may be able to communicate the same amount of programming data achieved by other SPI systems using fewer clock cycles, thereby improving the speed of communication of the SPI system.

The described SPI protocol may be compatible with other SPI protocols that do not currently enable daisy-chaining of the SPI slave chips. The SPI protocol may use one or more additional signals for operation (e.g., a load signal and a transmit/receive control signal) in addition to the SPI signals (e.g., slave data in (SDI), slave data out (SDO), clock (CLK), and chip select bar CSB) used for other SPI protocols.

Figure 1:
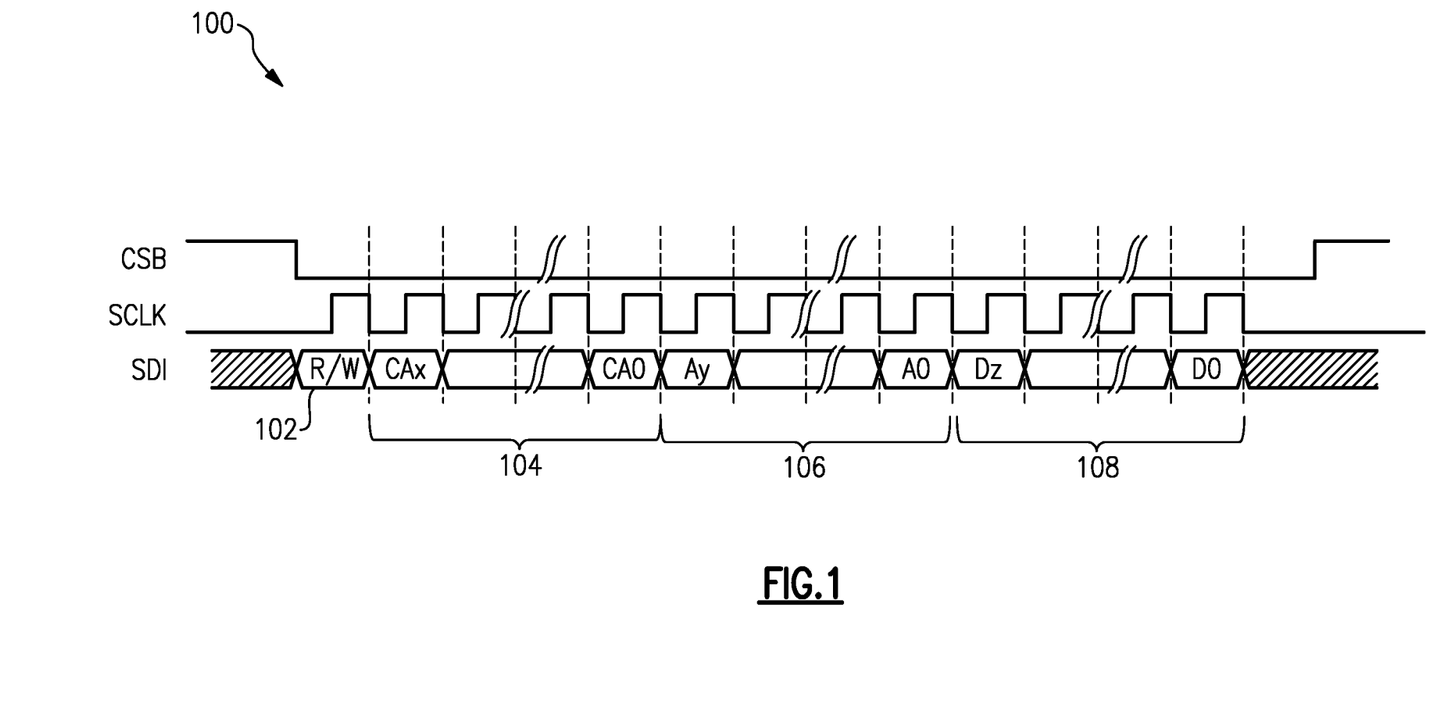
FIG. 1 schematically illustrates an exemplary frame format which can be used to communicate over an SPI interface in accordance with aspects of this disclosure.

FIG. 1 schematically illustrates an exemplary frame format 100 which can be used to communicate over an SPI interface in accordance with aspects of this disclosure. While FIG. 1 illustrates the frame format 100 which is labeled as "short," the frame length (e.g., which can be defined by the number of bits of data included in the frame) can be varied to provide frames with adjustable data length to write/read specific information having different data length. In some embodiments, the frames may have the following lengths: a "long" frame length, a "short" frame length, and an "extra-short" frame length.

In some such embodiments, the long frame can be used to program the gain and phase of all channels within a selected chip used for beamforming. The long frame can be implemented via the so-called "streaming" mode implemented in other SPI protocols. The short frame can be used to program the internal registers of the selected beamformer chip (which may correspond to regular mode in other SPI protocols). These are just two non-limiting examples to demonstrate the ability of the SPI interface to provide a frame with a variable data length. However, other frame lengths can be used to program the chip depending on the data length.

With reference to FIG. 1, the values for three data lines are illustrated, including a chip select bar CSB line, a clock SCLK line, and a slave data in SDI line. When the chip select bar CSB line has a low value, a SPI slave chip (e.g., see FIG. 3) receiving the low chip select bar CSB value may read the data on the slave data in SDI line based on timing indicated by the clock SCLK line. The data in the frame format 100 of FIG. 1 includes at least one read and write indicator bit 102, at least one header and chip address bit 104, at least one internal memory address bit 106, and at least one data bit 108.

Two example configurations can be used to connect several beamformer chips to the same SPI lines. The first approach is by using a daisy chain, in which the SPI slave chips are connected in series (e.g., see FIG. 3), while the second approach is by using parallel configuration (e.g., see FIG. 2). One advantage of the disclosed SPI interface is that the disclosed interface can be used in both the first and second configurations (e.g., in both the daisy chain and parallel configurations). One challenge in implementing an SPI interface that can support the daisy chain configuration is that the frame length may have a variable length. In order to support the varying frame length and daisy chain configuration, it is generally desirable that the SPI slave chip be adaptable to support these features. However, certain existing SPI chips do not include such adaptability.

Figure 2:
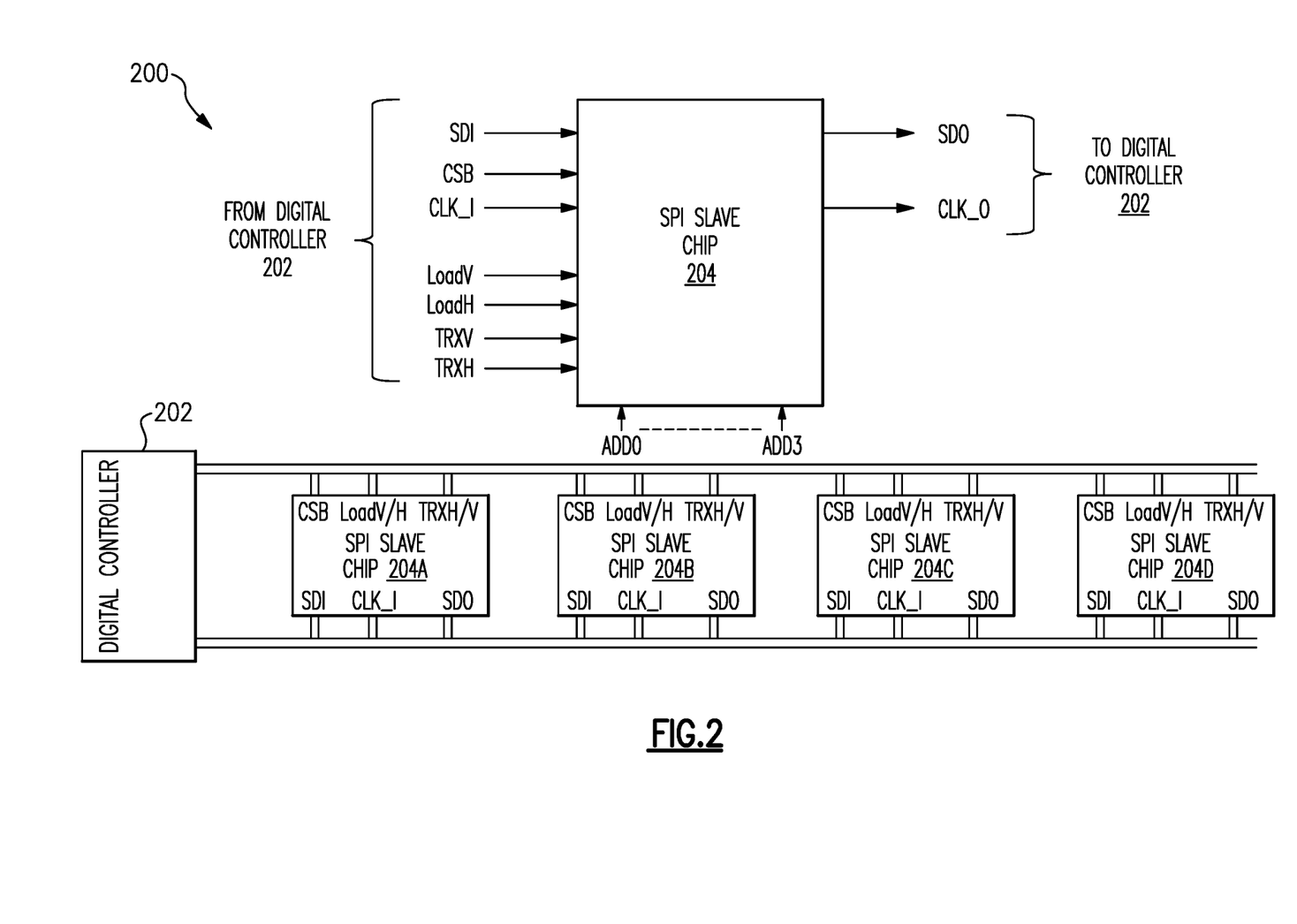
FIG. 2 schematically illustrates an exemplary system employing an SPI interface arranged in parallel in accordance with aspects of this disclosure.

To implement a parallel configuration as shown in FIG. 2, each of the chips has a specific address in the embodiments where all of the chips share the same SPI control signals. Referring to FIG. 1, the chip address bit(s) 104 of the frame 100 can be used to indicate the chip location. In other words, the chip address 104 can be used to address a selected chip from among the array of SPI slave chips that the SPI master chip can program. The read and write indicator bit(s) 102 can indicate whether the data bit(s) 108 should be read from or written to the selected SPI slave chip indicated by the chip address 104. The internal memory address bit(s) 106 can indicate a location within the internal memory of the selected SPI slave chip to or from which the data bit(s) 108 should be written or read.

The frame format 100 illustrated in FIG. 1 can also be modified to be of any frame length to support the variable frame length for data transmission. This can be achieved by changing the length of the data bit(s) 108 of the frame 100, without altering the other portions 102-106 of the frame 100. In some embodiments, this can be achieved by using stream mode of the other SPI protocols with which the described SPI interface is compatible.

FIG. 2 schematically illustrates an exemplary system 200 employing an SPI interface arranged in parallel in accordance with aspects of this disclosure. At the top of FIG. 2, an SPI slave chip 204 is illustrated with each of the signals input and output to/from the SPI slave chip 204. The bottom of FIG. 2 schematically illustrates how a plurality of lines are routed to each of the SPI slave chips 204A-204D to allow parallel communication between the SPI master 202 (also referred to as a digital controller) and each of the SPI slave chips 204A-204D. Although four SPI slave chips 204A-204D are illustrated in FIG. 2, the number of SPI slave chips can be greater than or fewer than four in various embodiments.

In order to provide parallel communication between the SPI master 202 and each of the SPI slave chips 204A-204D, a large number of lines can be routed therebetween. For example, as shown in FIG. 2, a slave data in SDI line, a chip select bar CSB line, a clock in line CLK_I, a LoadV line, a LoadH line, a TRXV line, a TRXH line, a slave data out SDO line, and a clock out CLK_O line may be routed between the SPI master 202 and each of the SPI slaves 204A-204D.

The LoadV line can be an external vertical setting pin configured to allow an external input to load settings for vertical controls. The LoadH line can be an external horizontal setting load pin configured to allow an external input to load settings for horizontal controls. In some embodiments, the LoadV and LoadH lines may be implemented as a single load line which can load the settings for both vertical and horizontal control. The TRXV line can be an external vertical directionality control pin configured to allow for switching between receive (RX) and transmit (TX) modes for the vertical controls. The TRXH line can be an external vertical directionality control pin configured to allow for switching between RX and TX modes for the horizontal controls. Similarly to the LoadV and LoadH lines, the TRXV and TRXH lines can be combined as a single input line.

In certain aspects, each SPI slave chip 204A-204D may receive input directly from the SPI master 202 and outputs directly to the SPI master 202 in the parallel system 200 of FIG. 2 (e.g., without the data being transmitted through another SPI slave chip 204A-204D). Further, the communication lines may be routed near each other, which may lead to interference between the signals transmitted on the lines. At higher frequencies of communication, this interference may corrupt the data being transmitted, and thus, there may be certain limitations to the speed at which data can be communicated over such a parallel configuration, particularly as the number of SPI slave chips 204A-204D increases.

When using the SPI communication protocol in, for example, a 5G beamforming application, a large number of SPI slave chips may be arrayed. In one implementation, a 9×9 array of chips may be used for a particular beamforming implementation. Thus, in these embodiments, it may be desirable to increase the speed at which data is communicated to the SPI slave chips 204A-204D using a daisy-chain or serial, configuration.

Figure 3:
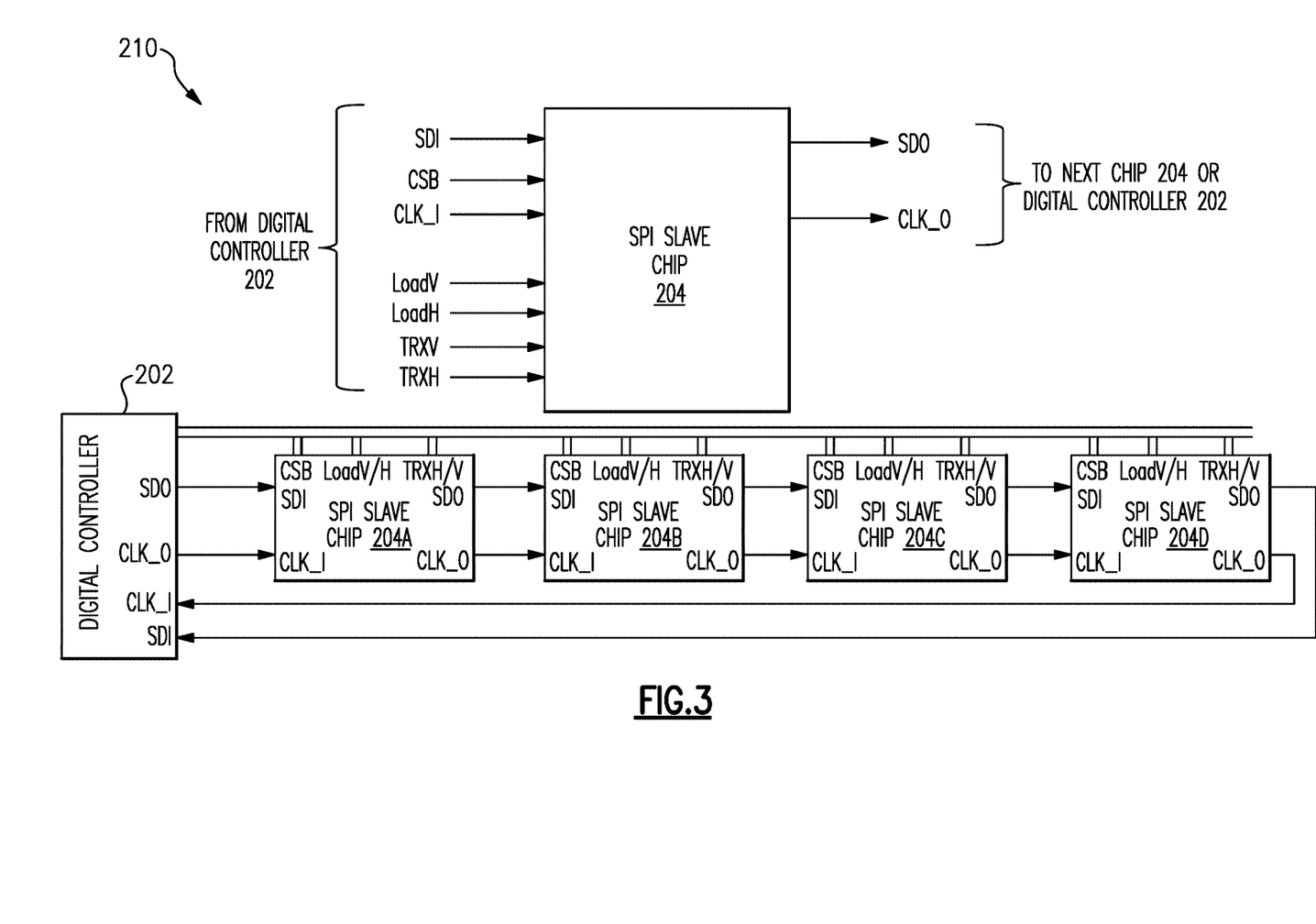
FIG. 3 schematically illustrates another exemplary system employing an SPI interface arranged in series in accordance with aspects of this disclosure.

FIG. 3 schematically illustrates another exemplary system 210 employing an SPI interface arranged in series in accordance with aspects of this disclosure. In FIG. 3, rather than the output of each SPI slave chip 204A-204D being connected back to the SPI master 202, the SPI slave chips 204A-204D are daisy chained such that the output of one SPI slave chip 204A-204D is input into the next SPI slave chip 204A-204D until the end of the chain, which is then output back to the SPI master 202. The daisy chaining may shift the input data each clock cycle and produce a shifted output that is injected to the next SPI slave chip 204A-204D in the chain. The delay of data being transmitted from one SPI slave chip 204A-204D to the next, in terms of number of clock cycles, depends on the frame length. Hence, each of the SPI slave chips 204A-204D is configured to be self-adaptable to produce the specified output based on the frame length.

Figure 4A:
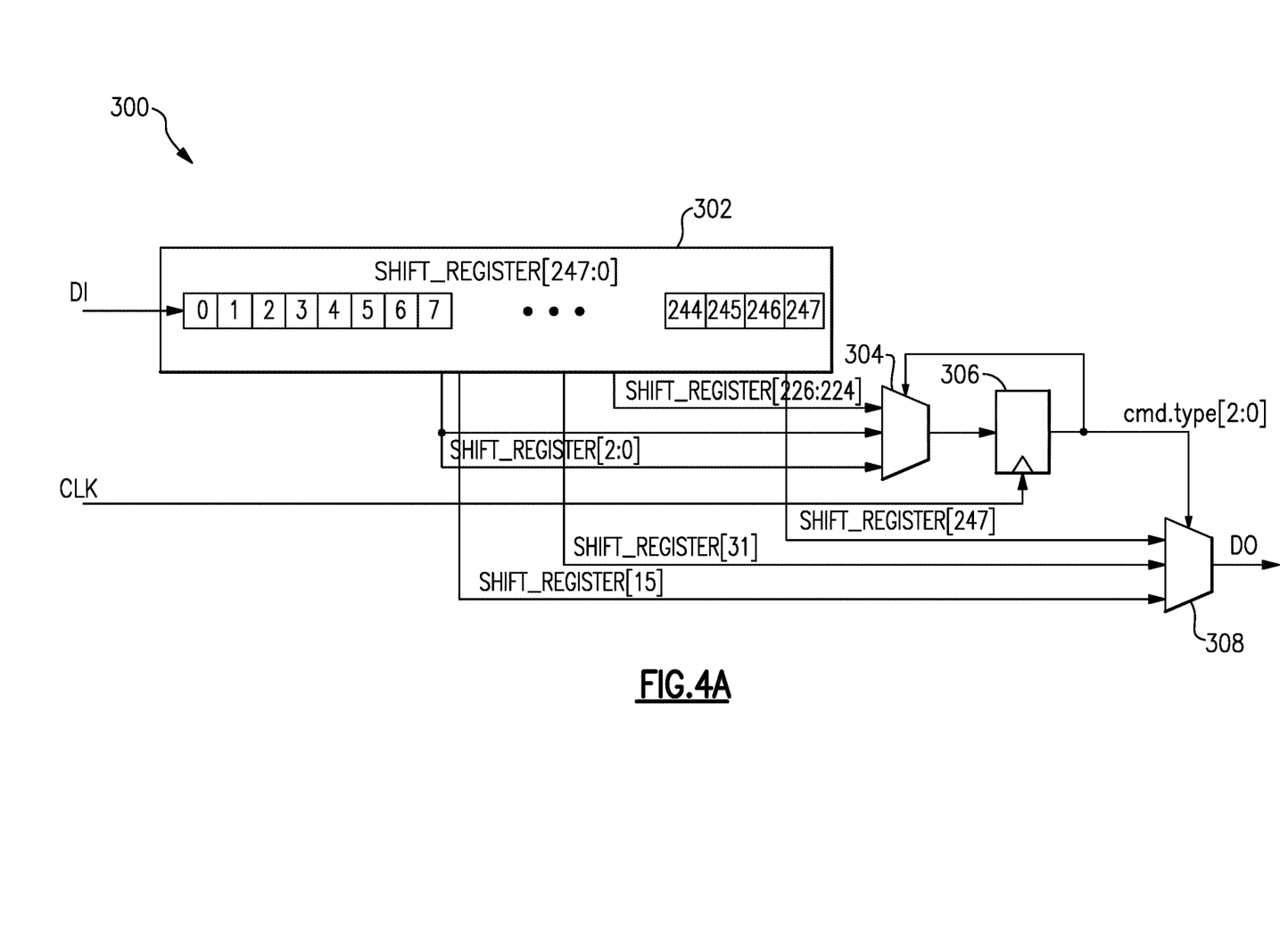
FIG. 4A schematically illustrates exemplary SPI interface control logic that can enable variable frame lengths in accordance with aspects of this disclosure.

FIG. 4A schematically illustrates exemplary SPI interface control logic 300 that can enable variable frame lengths in accordance with aspects of this disclosure. The SPI interface control logic 300 may form a portion of the logic included in each of the SPI slave chips (e.g., the SPI slave chips 204A-204D of FIG. 3) in order to enable the SPI chips to be connected in a daisy chain configuration.

As shown in FIG. 4A, the SPI interface control logic 300 includes a shift register 302, a first multiplexor 304, a latch 306, and a second multiplexor 308. The shift register 302 may receive data from the data input signal pin DI of the SPI slave chip (e.g., from line SDI illustrated in FIG. 3). This data can then be shifted through the shift register 302 at each clock cycle. The first multiplexor 304 can be used to read the command type (cmd.type[2:0]) from the shift register 302 based on the current format of the frame. The first multiplexor 304 can receive an indication of the current format of the frame from the latch 306, as described below. The command type may define the frame format for the next frame to be read into the shift register 302, and may comprise one or more bits of information (e.g., three bits as illustrated in FIG. 4). In certain embodiments, the command type is encoded into the header+chip address bit(s) 104 of the frame (see FIG. 1).

For the short format, the command type may be read into the latch 306 from one or more first positions (e.g., [2:0] in shown in FIG. 4A) of the shift register 302. In contrast, for the long format, the command type may be read into the latch 306 from one or more second positions (e.g., [226:224] in the illustrated embodiment) of the shift register 302. Since the command type may be located at different places within the shift register 302 depending on the command type of the frame currently stored in the shift register 302, the command type output from the latch 306 may be used as an input to the first multiplexor 304 when the multiplexor 304 selects the command type for the next frame to be read into the latch 306.

In certain aspects illustrated in FIG. 4A, the latch 306 may receive a clock signal CLK that can be generated internally to the SPI slave chip. For example, the SPI slave chip may include logic (not illustrated) configured to generate the clock signal CLK based on the clock signal received at the clock input pin CLK_I (see FIG. 3) and the command type stored in the latch 306. Thus, the latch 306 can store a new command type signal based on the clock signal CLK that is timed in accordance with the command type currently stored in the latch 306 and the input clock signal received at pin CLK_I. In some cases, the CLK signal may only be generated when a write, or other command, is desired or received. In other cases, the CLK signal is generated during operation of the SPI interface control logic 300.

The second multiplexor 308 is used to select one of the positions in the shift register 302 to apply as the output from the SPI slave chip 204A-204D. In certain aspects as shown in FIG. 4A, position 15 can be used for an extra-short frame format, position 31 can be used for the short format, and position 247 can be used for the long frame format. Thus, the data from the position selected based on the command type defining the current frame type can be used to shift data out of the shift register 302 to the output port DO. This, in turn, establishes the current effective length of the shift register 302 within the chip. However, the positions of the shift register 302 used as the output of the SPI slave chip 204A-204D can depend on the specific frame formats used for SPI communication. For example, if the lengths of the frames are different from the short, extra-short, and long frame formats described herein, the positions of the shift register 302 used as the output of the SPI slave chip 204A-204D can vary.

Figure 4B:
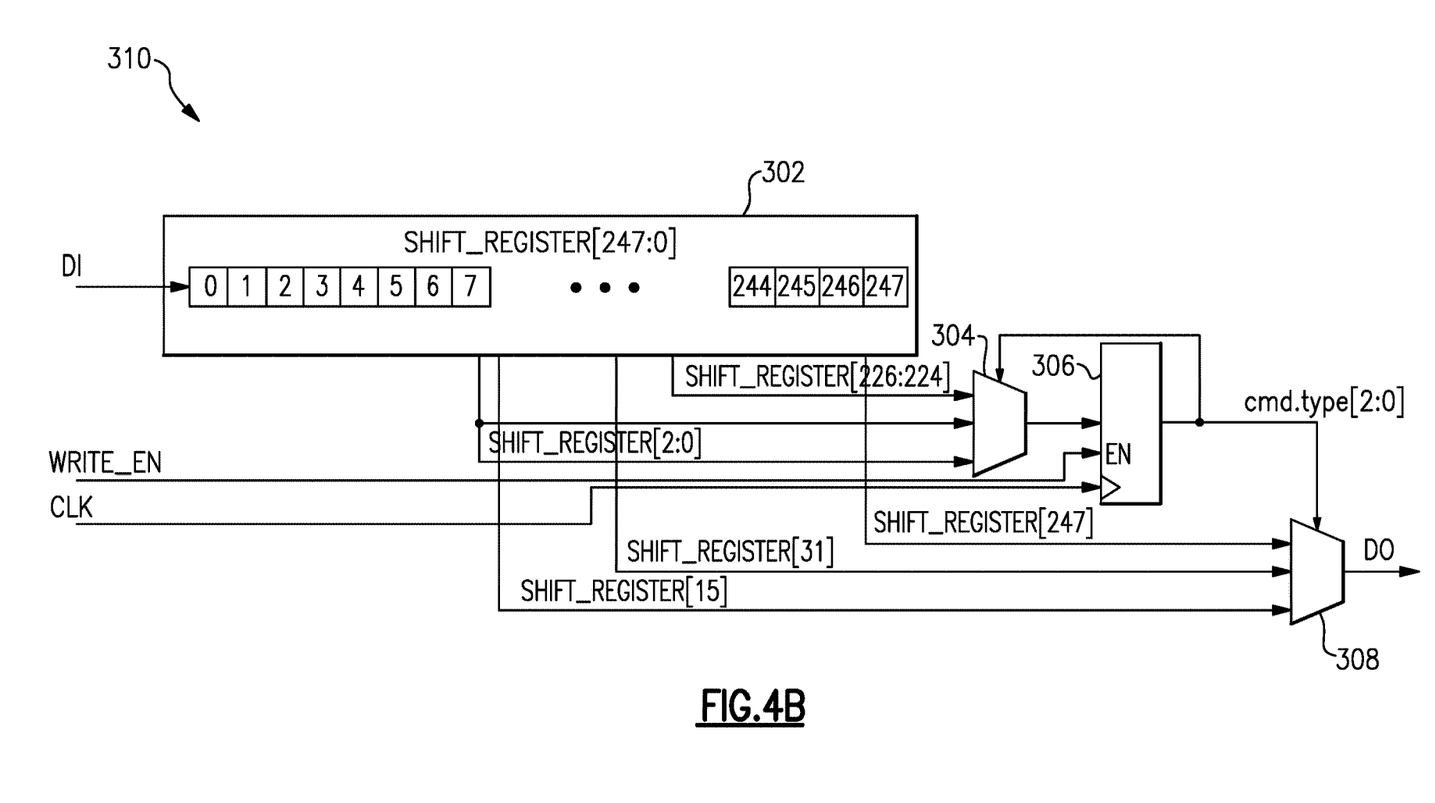
FIG. 4B schematically illustrates another exemplary SPI interface control logic that can enable variable frame lengths in accordance with aspects of this disclosure.

FIG. 4B schematically illustrates some additional aspects of exemplary SPI interface control logic 310 that can enable variable frame lengths in accordance with aspects of this disclosure. The SPI interface control logic 310 may be similar to aspects illustrate in FIG. 4A with the addition of a write enable WRITE_EN line.

In certain aspects of FIG. 4B, the latch 306 may receive a clock signal CLK and a write enable signal WRITE_EN that can be generated internally to the SPI slave chip. For example, the SPI slave chip may include logic (not illustrated) configured to generate the write enable signal WRITE_EN based on the clock signal CLK which may be the same asn the clock signal received at the clock input pin CLK_I (see FIG. 3). The logic of the SPI slave chip may further generate the write enable signal WRITE_EN based on the command type stored in the latch 306. Thus, the latch 306 can store a new command type signal based on the clock signal CLK and the write enable signal WRITE_EN that is timed in accordance with the command type currently stored in the latch 306, write enable signal WRITE_EN, and the clock signal CLK, which may be the same as the input clock signal received at pin CLK_I.

In certain aspects in which an SPI interface is used for beamforming, beamformer chips or beamformers (e.g., the SPI slave chips 204A-204D) can be adapted to support several frame formats to satisfy timing requirements using, for example, as shown in FIGS. 4A and 4B. The beamformers included in the daisy chain operation may include on board logic that defines when the data should be routed to the next chip depending on the frame format (e.g., the command type). In certain aspects of FIGS. 4A and 4B, control of the variable shift register 302 length involves multiplexing out the correct bit position (e.g., position 15, 31, or 247) in the shift register 302 depending on an internal register value. The internal register may, in some cases, be pre-programmed. The data position from the shift register 302 for updating the command type value may also be dependent on feedback of the command type value from the current frame into the first multiplexor 304 driving the value stored on the latch 306 for the next command type.

Figure 5:
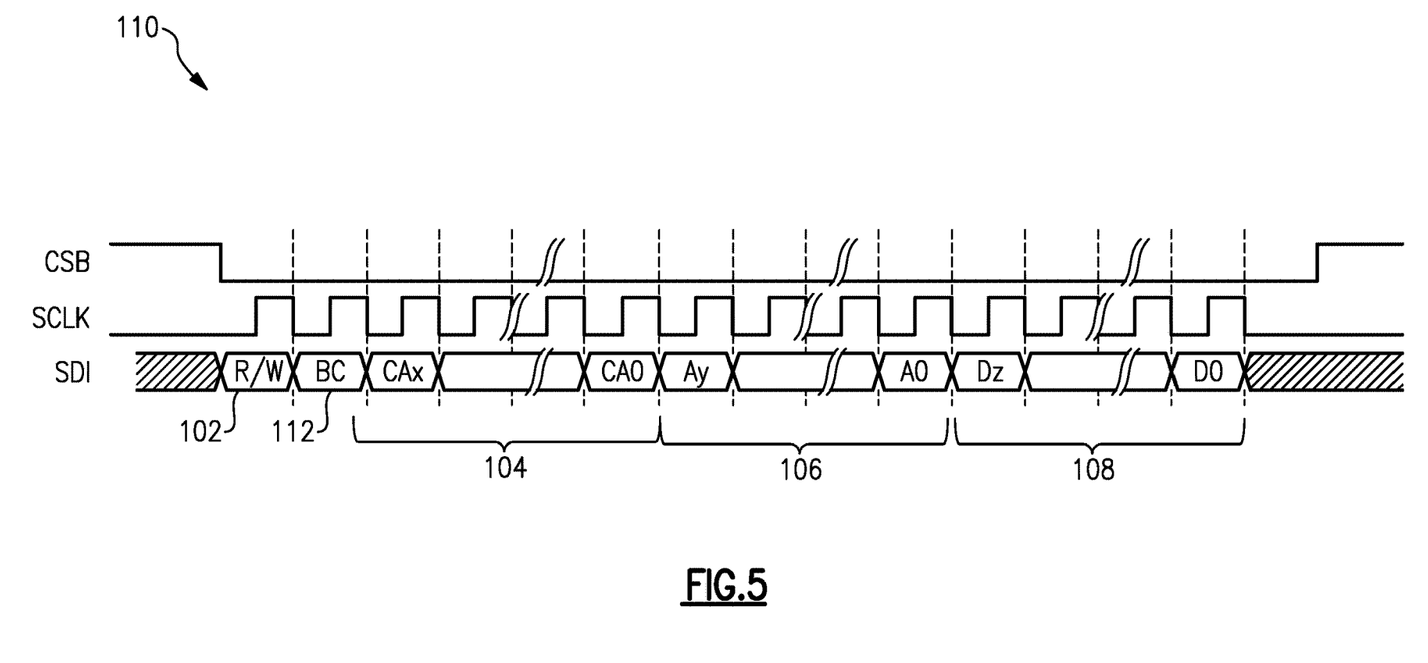
FIG. 5 schematically illustrates another exemplary system employing an SPI interface that can provide broadcast mode in accordance with aspects of this disclosure.
Figure 6:
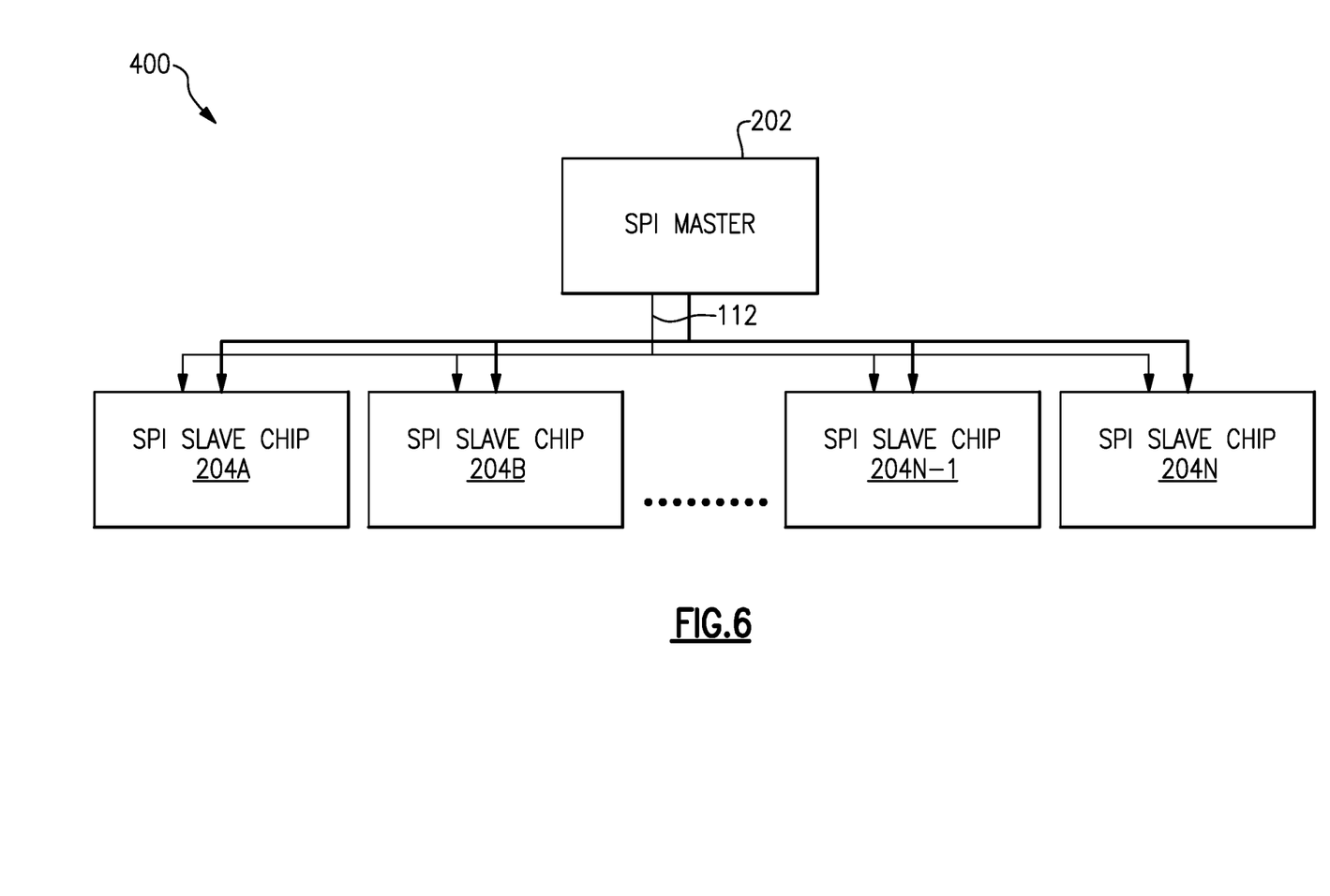
FIG. 6 schematically illustrates yet another exemplary system employing an SPI interface that can provide broadcast mode in accordance with aspects of this disclosure.

FIGS. 5 and 6 schematically illustrate exemplary systems employing an SPI interface that can provide a broadcast mode in accordance with aspects of this disclosure. In the broadcast mode, the SPI Master 202 can communicate with multiple SPI slave chips 204A-204N and each SPI slave chip 204A-204N controls multiple beamforming channels. Broadcast mode may be used in certain cases where it may be desirable to write the same data to all SPI slave chips 204A-204N (e.g., start-up, initialization, common commands).

FIG. 5 schematically illustrates an exemplary frame format 110 which can be used to communicate in broadcast mode over an SPI interface in accordance with aspects of this disclosure. Compared with the frame format 100 of FIG. 1, each frame in the frame format 110 illustrate in FIG. 5 may include one or more additional bits in the address bits referred to as broadcast bit(s) 112 which signals when broadcast mode is active. The SPI slave chips 204A-204N can be configured to execute any command sent when the broadcast bit(s) 112 are signaled.

FIG. 6 schematically illustrates an exemplary system 400 employing an SPI interface arranged in parallel in order to communicate in broadcast mode in accordance with aspects of this disclosure. The system 400 includes an SPI master chip 202 connected in parallel to a plurality of SPI slave chips 204A-204N. Referring to FIG. 6, each SPI slave chip 204A-204N can have an additional external input pin connected to a signal line 112 from the SPI master 202 than can command all SPI slave chips 204A-204N to execute the SPI commands following receipt of the broadcast signal at the SPI slave chips 204A-204N. Thus, no changes to the address bits are required in aspect shown in FIG. 6, while no additional signal lines are required in aspects shown in FIG. 5.

Aspects of this disclosure can be implemented in various electronic devices. Examples of the electronic devices can include, but are not limited to, consumer electronic products, parts of the consumer electronic products, electronic test equipment, cellular communications infrastructure such as a base station, radar systems, military communications and countermeasures etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products.

Unless the context clearly requires otherwise, throughout the description, the claims, and/or the aspects of the example embodiments, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure.

For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The various features and processes described above may be implemented independently of one another, or may be combined in various ways. All possible combinations and subcombinations of features of this disclosure are intended to fall within the scope of this disclosure.

What is claimed is:

1. A semiconductor device for communication via a serial peripheral interface (SPI), comprising:
   one or more inputs configured to receive frame data;
   an internal memory configured to store the received frame data;
   a shift register configured to receive the frame data and comprising a plurality of shift register bit positions;
   a latch configured to store a command type;
   a first multiplexor configured to select at least one first bit from the shift register based on the command type and provide the at least one first bit to the latch;
   an output configured to output the frame data; and
   a second multiplexor configured to select at least one second bit from the shift register based on the command type and provide the at least one second bit to the output.

2. The semiconductor device of claim 1, wherein the first multiplexor is further configured to select the at least one first bit from a first shift register bit position when the command type indicates that the frame data has a first frame type and select the at least one first bit from a second shift register bit position when the command type indicates that the frame data has a second frame type.

3. The semiconductor device of claim 2, wherein the first frame type is a short format having a first frame length defined by a first number of bits of data and the second frame type is a long format having a second frame length defined by a second number of bits of data, the second number is greater than the first number, and wherein the second shift register bit position has a higher value than the first number.

4. The semiconductor device of claim 1, wherein the second multiplexor is further configured to select the at least one second bit from a first shift register bit position when the command type indicates that the frame data has a first frame type, select the at least one second bit from a second shift register bit position when the command type indicates that the frame data has a second frame type, and select the at least one second bit from a third shift register bit position when the command type indicates that the frame data has a third frame type.

5. The semiconductor device of claim 4, wherein the first frame type is an extra-short format having a first frame length defined by a first number of bits of data, the second frame type is a short format having a second frame length defined by a second number of bits of data, and the third frame type is a long format having a third frame length defined by a third number of bits of data, the second number is greater than the first number and the third number is greater than the second number, wherein the second shift register bit position has a higher value than the first number and the third shift register bit position has a higher value than the second number.

6. The semiconductor device of claim 1, wherein the latch is further configured to receive the command type from the first multiplexor.

7. The semiconductor device of claim 6, wherein the latch is further configured to receive a clock signal and store the command type received from the first multiplexor based on an edge of the clock signal.

8. The semiconductor device of claim 6, wherein the latch is further configured to receive an enable signal and a clock signal and store the command type received from the first multiplexor based on an edge of the clock signal and in response to receiving the enable signal.

9. The semiconductor device of claim 1, wherein the one or more inputs are configured to receive the frame data indirectly from a master semiconductor device via a slave semiconductor device.

10. The semiconductor device of claim 1, wherein the one or more inputs and the output are configured to be connected to a plurality of slave semiconductor devices in either a parallel configuration or a series configuration.

11. A semiconductor device, comprising:
a first input configured to receive a clock signal;
a second input configured to receive frame data;
a third input configured to receive a semiconductor device select signal;
a shift register configured to receive the frame data; and
an internal memory configured to store the frame data,
wherein, the frame data comprises one or more bits comprising a broadcast indicator.

12. The semiconductor device of claim 11, wherein the frame data further comprises:
one or more bits indicative of a semiconductor device address,
one or more bits indicative of an internal memory address,
one or more bits comprising data, and
one or more bits comprising a read and write indicator.

13. The semiconductor device of claim 12, wherein the semiconductor device further comprises logic configured to:
determine that the one or more broadcast indicator bits are disabled,
determine that the read and write indicator bits are indicative of write,
match the semiconductor address bits to an address of the semiconductor device, and
store the data in the internal memory based on the internal memory address bits.

14. The semiconductor device of claim 12, wherein the semiconductor device further comprises logic configured to:
determine that the broadcast indicator bits are enabled,
determine that the read and write indicator bits are for write, and
store the data in the internal memory based on the internal memory address bits.

15. The semiconductor device of claim 12, wherein the semiconductor device further comprises logic configured to:
determine that the read and write indicator bits are for read,
match the semiconductor address bits to an address of the semiconductor device,
ignore the broadcast indictor bits, and
read data from the internal memory based on the internal memory address bits.

16. A serial peripheral interface (SPI) system, comprising:
a primary SPI chip configured to output frame data and a broadcast indicator signal; and
a plurality of secondary SPI chips configured to receive the frame data and the broadcast indicator signal from the primary SPI chip,
wherein the secondary SPI chips are further configured to store the frame data in response to the broadcast indicator signal being enabled.

17. The SPI system of claim 16, wherein each of the secondary SPI chips comprises:
a first input configured to receive a clock signal;
a second input configured to receive the frame data;
a third input configured to receive a semiconductor device select signal;
one or more fourth inputs configured to receive the broadcast indicator signal;
a shift register configured to receive the frame data; and
an internal memory to store the frame data.

18. The SPI system of claim 17, wherein, the frame data comprises:
one or more bits indicative of a semiconductor device address,
one or more bits indicative of an internal memory address,
one or more bits comprising data, and
one or more bits comprising a read and write indicator.

19. The semiconductor device of claim 18, wherein each of the secondary SPI chips further comprises logic configured to:
determine that the broadcast indicator signal is disabled,
determine that the read and write indicator bits are for write,
match the semiconductor address bits to an address of the semiconductor device, and
store the data in the internal memory based on the internal memory address bits.

20. The semiconductor device of claim 18, wherein each of the secondary SPI chips further comprises logic configured to:
determine that the broadcast indicator signal is enabled,
determine that the read and write indicator bits are for write, and
store the data in the internal memory based on the internal memory address bits.

* * * * *